United States Patent
Haymore et al.

(10) Patent No.: US 12,043,891 B2
(45) Date of Patent: Jul. 23, 2024

(54) DEPOSITION METHOD OF A METALLIC LAYER ON A SUBSTRATE OF A RESONATOR DEVICE

(71) Applicant: SPTS Technologies Limited, Newport (GB)

(72) Inventors: Scott Haymore, Newport (GB); Adrian Thomas, Newport (GB); Steve Burgess, Newport (GB)

(73) Assignee: SPTS Technologies Limited, Newport (GB)

( * ) Notice: Subject to any disclaimer, the term of this patent is extended or adjusted under 35 U.S.C. 154(b) by 671 days.

(21) Appl. No.: 17/196,999

(22) Filed: Mar. 9, 2021

(65) Prior Publication Data

US 2021/0317565 A1    Oct. 14, 2021

(30) Foreign Application Priority Data

Apr. 9, 2020 (GB) ...................... 2005318

(51) Int. Cl.
*H03H 3/08* (2006.01)
*C23C 14/16* (2006.01)
(Continued)

(52) U.S. Cl.
CPC .......... *C23C 14/165* (2013.01); *C23C 14/351* (2013.01); *H03H 3/08* (2013.01);
(Continued)

(58) Field of Classification Search
CPC ..... C23C 14/165; C23C 14/351; C23C 14/35; Y10T 29/42; Y10T 29/49155; H03H 3/08;
(Continued)

(56) References Cited

U.S. PATENT DOCUMENTS 11,274,360 B2 *   3/2022   Benetti ................ C23C 14/352
11,462,399 B2 * 10/2022   Ebata ................ H01L 21/02631

FOREIGN PATENT DOCUMENTS

JP    2000178722 A    6/2000

OTHER PUBLICATIONS

Poudyal et al., "Characterization of confocal sputtered molybdenum thin films for aluminum nitride growth", Thin solid films, Jan. 1, 2020, 137657-1 to 137657-7, vol. 693, Elsevier.
(Continued)

*Primary Examiner* — Donghai D Nguyen
(74) *Attorney, Agent, or Firm* — Hodgson Russ LLP

(57) ABSTRACT

Sputter depositing a metallic layer on a substrate in the fabrication of a resonator device includes providing a magnetron sputtering apparatus comprising a chamber, a substrate support disposed within the chamber, a target made from a metallic material, and a plasma generating device, wherein the substrate support and the target are separated by a distance of 10 cm or less; supporting the substrate on the substrate support; performing a DC magnetron sputtering step that comprises sputtering the metallic material from the target onto the substrate so as to form a metallic layer on the substrate, wherein during the DC magnetron sputtering step the chamber has a pressure of at least 6 mTorr of a noble gas, the target is supplied with a power having a power density of at least 6 W/cm$^2$, and the substrate has a temperature in the range of 200-600° C.

18 Claims, 3 Drawing Sheets

(51) Int. Cl.
  *C23C 14/35* (2006.01)
  *H03H 9/02* (2006.01)
(52) U.S. Cl.
  CPC .... *H03H 9/02047* (2013.01); *H03H 9/02574* (2013.01); *H03H 9/02614* (2013.01)
(58) Field of Classification Search
  CPC .......... H03H 9/02047; H03H 9/02574; H03H 9/02007; H03H 9/02535
  See application file for complete search history.

(56) References Cited

OTHER PUBLICATIONS

Martin et al., "Process optimization for the sputter deposition of molybdenum thin films as electrode for AlN thin films", Journal of Vacuum Science & Technology, May 22, 2006, pp. 946-952, vol. 24, issue 4, AIP publishing LLC.

Liu et al., "Effects of Mo films prepared via different sputtering conditions on the formation of MoSe2 during selenization", Journal of Alloys and Compounds, May 30, 2018, pp. 621-628, vol. 747, Elsevier.

Ababneh et al., "Electrical and morphological characterization of platinum thin-films with various adhesion layers for high temperature applications", Microsystem technologies, Nov. 14, 2015, pp. 703-709, vol. 23, Issue 3, Springer Nature.

EPO, European Search Report for EP Application No. 21159617, Sep. 7, 2021.

Guilloux-Viry et al., "Epitaxially grown molybdenum thin films deposited by laser ablation on (100)MgO substrates," Thin Solid Films, 1996, vol. 280, pp. 76-82.

Vuong et al., "Low resistivity molybdenum thin film towards the back contact of dye-sensitized solar cell," Bulletin of Materials Science, 2015, vol. 38, No. 7, pp. 1891-1897.

Yong et al., "The optimization of molybdenum back contact films for Cu(In,Ga)Se2 solar cells by the cathodic arc ion plating method," Thin Solid Films, 2013, vol. 548, pp. 162-167.

\* cited by examiner

DEPOSITION METHOD OF A METALLIC LAYER ON A SUBSTRATE OF A RESONATOR DEVICE

CROSS-REFERENCE TO RELATED APPLICATIONS

This application claims priority to UK Patent Application No. 2005318.7 filed Apr. 9, 2020, the disclosure of which is hereby incorporated by reference.

FIELD OF THE DISCLOSURE

This invention relates to a method of sputter depositing a metallic layer on a substrate. More specifically, this invention relates to a method of sputter depositing a metallic layer on a substrate in the fabrication of a resonator device, such as a bulk acoustic wave (BAW) device or a surface acoustic wave (SAW) device. This invention also relates to a method of fabricating a resonator device. This invention also relates to associated substrates comprising a metallic layer, and to associated resonator devices.

BACKGROUND OF THE DISCLOSURE

Resonator devices, such as bulk acoustic wave (BAW) devices and surface acoustic wave (SAW) devices, have a wide range of applications. For example, BAW devices are used in cell phone and other wireless applications to allow a specific radio frequency to be received and/or transmitted. These resonator devices utilise the piezoelectric effect to generate a mechanical resonance from an electric input and can also convert a mechanical resonance into an electrical output.

Resonator devices typically comprise a plurality of layers that are sequentially deposited on a substrate, such as a patterned silicon substrate. The layers typically include a piezoelectric layer, such as AlN or AlScN, disposed between two metal electrodes. Physical vapour deposition (PVD) techniques, such as sputtering, can be used to deposit these layers.

There is a desire to reduce the thickness of the layers in resonator devices in order to develop devices suitable for 5G and future generations of RF filters. However, as the piezoelectric layer becomes thinner, the within wafer stress variation across the electrode layers makes a more prominent contribution to the coupling properties of the device stack. That is, the within wafer stress variation of the electrodes becomes a more noticeable factor in the control of the coupling uniformity across the wafer. It is desirable to develop methods to deposit electrode layers having a stress range of less than about 200 MPa, whilst also maintaining good thickness uniformities, preferably <1% 1σ, across the whole surface of the substrate (e.g. a 200 mm silicon wafer) with a minimal (e.g. <5 mm) edge exclusion region. It is also desirable for the stress of the electrode layer to be tuneable dependent upon the desired application.

The electrode layers for resonator devices, such as AlN or AlScN resonator devices, must also be conductive with a low thermo-elastic loss. The electrode layers should also provide a suitable surface to grow the piezoelectric material with a preferred crystal orientation.

Molybdenum (Mo) is known to exhibit 56 times less thermo-elastic loss than Al, and has been used as a material for electrode layers. Bulk resistivity of Mo is 5.34 µΩ·cm. However, known methods of sputter depositing Mo electrode layers generally provide a Mo layer having a resistivity of not less than about 11 µΩ·cm. It is therefore desirable to develop a method of depositing electrode layers, such as Mo layers, that exhibit reduced resistivity. This will enable the electrode layers to be made thinner, reducing device losses, and providing a higher quality factor in the resultant resonator devices.

BRIEF SUMMARY OF THE DISCLOSURE

The present invention, in at least some of its embodiments, seeks to address the above described problems, desires and needs. In particular, embodiments of the present invention seek to provide a method that results in a metallic layer exhibiting a resistivity of less than about 10 µΩ·cm, whilst enabling excellent stress control and excellent uniformity in the thickness of the deposited metallic layer. Overall, this can lead to higher quality resonator devices, such as BAW and SAW devices, with reduced losses. These desirable properties are critical in developing the next generation of high quality resonator devices.

According to a first aspect of the present invention there is provided a method of sputter depositing a metallic layer on a substrate in the fabrication of a resonator device, wherein the metallic layer is composed of a metal selected from molybdenum (Mo), tungsten (W), titanium (Ti), tantalum (Ta), platinum (Pt) or ruthenium (Ru), the method comprising the steps of:

providing a magnetron sputtering apparatus comprising a chamber, a substrate support disposed within the chamber, a target made from a metallic material, and a plasma generating device, wherein the substrate support and the target are separated by a distance of 10 cm or less;

supporting the substrate on the substrate support;

performing a DC magnetron sputtering step that comprises sputtering the metallic material from the target onto the substrate so as to form a metallic layer on the substrate, wherein during the DC magnetron sputtering step the chamber has a pressure of at least 6 mTorr (at least about 0.8 Pa) of a noble gas, the target is supplied with a power having a power density of at least 6 W/cm², and the substrate has a temperature in the range of 200-600° C.

Known methods of sputter depositing metals in the fabrication of resonator devices operate at low chamber pressure, typically less than 4 mTorr. The currently received wisdom in the art is that operating at a higher pressure leads to the sputtered material being scattered more by the plasma. Consequently, the energy of the species depositing on the substrate is reduced, which results in a less dense film with a greater amount of gas becoming incorporated within the deposited layer. The currently received wisdom in the art is that a higher gas pressure leads to films exhibiting higher resistivity, which is undesirable. Therefore, the process conditions of the present invention go completely against the currently received wisdom in the art.

The present inventors have discovered that performing the DC magnetron sputtering step with the combination of a chamber pressure of at least 6 mTorr and a target power density of at least 6 W/cm² provides a metallic layer exhibiting a resistivity of less than about 10 µΩ·cm. Additionally, by using these process conditions, the stress in the metallic layer can be controlled to be either compressive, tensile or about zero as desired, with a stress range of less than about 250 MPa, optionally less than 200 MPa, optionally less than 150 MPa, and optionally less than 120 Pa. Further still, the method enables excellent thickness control and thickness uniformity.

Without wishing to be bound by any theory or conjecture, it is believed that by performing the DC magnetron sputtering step at a high chamber pressure together with a high power density supplied to the target (cathode), there is still sufficient flux of energetic ions and neutral species bombarding the substrate to create a dense metallic layer with minimal levels of gas incorporation. More specifically, it is believed that the high power density applied to the target (i.e. at least 6 W/cm$^2$) compensates for the increased gas scattering, and in turn compensates for the attenuation of the energy of the sputtered species that arises due to the increased chamber pressure. Overall, the combination of high chamber pressure (i.e. at least 6 mTorr) and high power density supplied to the target (i.e. at least 6 W/cm$^2$) provides suitable conditions to deposit metallic layers having a reduced resistivity.

The substrate can be a silicon substrate. The substrate can be a silicon wafer.

The power supplied to the target can have a power density of at least 8 W/cm$^2$, optionally at least 10 W/cm$^2$, optionally at least 12 W/cm$^2$, optionally at least 14 W/cm$^2$, or optionally at least 16 W/cm$^2$. The power supplied to the target can have a power density of less than about 24 W/cm$^2$, optionally, less than about 22 W/cm$^2$, optionally less than about 20 W/cm$^2$, optionally less than about 18 W/cm$^2$, or optionally less than about 16 W/cm$^2$. The power density can be any combination of these upper and lower limits. In addition to the benefits described above, a high power density can increase the deposition rate.

During the DC magnetron sputtering step the chamber can have a pressure of at least 7 mTorr, optionally at least 8 mTorr, optionally at least 9 mTorr, optionally at least 10 mTorr. During the DC magnetron sputtering step the chamber can have a pressure of about 20 mTorr or less, optionally about 15 mTorr or less, optionally about 12 mTorr or less, optionally about 10 mTorr or less, or optionally about 8 mTorr or less. The pressure can be any combination of these upper and lower limits.

The DC magnetron sputtering step is performed at a temperature of at least 200° C., optionally at least 300° C., or optionally about 400° C. The DC magnetron sputtering step is performed at a temperature of about 600° C. or less, optionally about 500° C. or less, or optionally about 400° C. or less. The DC magnetron sputtering step can be performed at any combination of these upper and lower limits. During the DC magnetron sputtering step, a bias power can be supplied to the substrate support. Supplying a bias power to the substrate support can control the stress of the as deposited metallic layer. Applying a high bias power can result in the as deposited metallic layer being more compressive (less tensile). The bias power applied to the substrate support can be selected so as to minimise the stress in the metallic layer. For example, the bias power applied to the substrate support can be selected so as to provide a metallic layer having an average stress of about zero (0 MPa). The bias power can be an RF bias power. The RF bias power have a frequency of 13.56 Hz. The bias power can have a power of at least 10 W, optionally at least 50 W, optionally at least 100 W, optionally at least 200 W, optionally at least 250 W, or optionally at least 300 W. The bias power can have a power of about 600 W or less, optionally about 500 W or less, optionally about 400 W or less, optionally about 300 W or less, or optionally about 200 W or less. The bias power can have a power between any combination of these upper and lower limits.

The metallic material is a metal selected from molybdenum (Mo), tungsten (W), titanium (Ti), tantalum (Ta), platinum (Pt), or ruthenium (Ru). These metals have a low thermo-elastic loss. For example, Mo can exhibit about 56 times less thermo-elastic loss compared to aluminium. Therefore, using these low thermo-elastic loss metals as an electrode layer in a resonator device can significantly improve (reduce) thermo-elastic losses, thereby improving the quality of the resonator device.

The DC magnetron sputtering step can comprise sputtering the metallic material from the target using a plasma formed from the noble gas. The noble gas can be argon (Ar), krypton (Kr), xenon (Xe) or a mixture thereof. A noble gas is understood to be a gas of Group 18 of the periodic table.

The metallic layer can have a thickness of about 500 nm or less, optionally about 350 nm or less, optionally about 300 nm or less, optionally about 250 nm or less, optionally about 200 nm or less, or optionally about 150 nm or less.

The substrate support and the target can be separated by a distance of about 75 mm or less.

The substrate support can be stationary during the DC magnetron sputtering step. For example, the substrate support can be rotationally stationary (i.e. not rotating) during the DC magnetron sputtering step.

The resonator can be an acoustic wave device. The resonator device can be a bulk acoustic wave (BAW) device. The resonator device can be a surface acoustic wave (SAW) device.

According to a second aspect of the invention there is provided a method of fabricating a resonator device comprising the steps of:
  (a) providing a substrate;
  (b) depositing a first metallic layer onto the substrate;
  (c) depositing a piezoelectric layer onto the first metallic layer; and
  (d) depositing a second metallic layer onto the piezoelectric layer, wherein at least one of steps (b) and (d) are performed using the method according to the first aspect.

The substrate can be a silicon substrate. The piezoelectric layer can comprise AlN, AlScN, or another suitable piezoelectric material. The resonator device can be a BAW device or a SAW device.

According to a third aspect of the invention there is provided a substrate comprising a metallic layer, such as a molybdenum layer, deposited using the method according to the first aspect, wherein the metallic layer has a resistivity of less than about 10 μΩ·cm.

The resistivity can be less than about 9 μΩ·cm. The resistivity can be in a range of 8-10 μΩ·cm, optionally 8-9 μΩ·cm. Low resistivity metallic layers can be made thinner whilst achieving the same contact resistance. This can lead to smaller, higher quality devices. The substrate can be a silicon substrate, such as a silicon wafer. The metallic layer can have a stress range of less than about 250 MPa, optionally less than about 200 MPa, optionally less than about 150 MPa, or optionally less than about 120 MPa. The metallic layer can be an electrode layer.

The metallic layer can be a tungsten (W), titanium (Ti), tantalum (Ta), platinum (Pt), or ruthenium (Ru) layer.

According to a fourth aspect of the invention there is provided a resonator device comprising a metallic layer, such as a molybdenum layer, deposited using the method according to the first aspect, wherein the metallic layer has a resistivity of less than about 10 μΩ·cm.

The metallic layer can have a stress variation of less than 250 MPa, optionally less than about 200 MPa, optionally less than about 150 MPa, optionally less than about 120 MPa. The within wafer stress of the resonator device can have a stress range of less than about 250 MPa, optionally less than about 200 MPa, optionally less than about 150 MPa, or optionally less than about 120 MPa. The metallic layer can be an electrode layer. The metallic layer can be a tungsten (W), titanium (Ti), tantalum (Ta), platinum (Pt), or ruthenium (Ru) layer.

The resonator device can be an acoustic wave device. The resonator device can be a bulk acoustic wave (BAW) device. The resonator device can be a surface acoustic wave (SAW) device.

Whilst the invention has been described above, it extends to any inventive combination of the features set out above, or in the following description, drawings or claims. For example, any features disclosed in relation to one aspect of the invention may be combined with any features disclosed in relation to any of the other aspects of the invention.

DESCRIPTION OF THE DRAWINGS

Embodiments of the invention will now be described, by way of example only, with reference to the accompanying drawings, in which.

DETAILED DESCRIPTION OF THE DISCLOSURE

Embodiments of the present invention relate to methods of sputter depositing a metallic layer onto a substrate in the fabrication of a resonator device, such as a bulk acoustic wave (BAW) or surface acoustic wave (SAW) device. Exemplary methods of the present invention can be performed using a suitable DC magnetron sputtering apparatus 10, as shown schematically in FIG. 1. A SPTS Sigma® deposition system with a DC Magnetron sputtering module, which is commercially available from SPTS Technologies Limited based in Newport, South Wales, UK, is suitable for performing DC magnetron sputtering methods according to embodiments of the present invention. Some well-known features of the DC magnetron sputtering apparatus 10 have been omitted from the figures for the sake of simplicity. The general operation of such a DC magnetron sputtering apparatus (e.g. generating a plasma) is well-known in the art and will not be described here other than where necessary for an understanding of the present invention.

Figure 1:
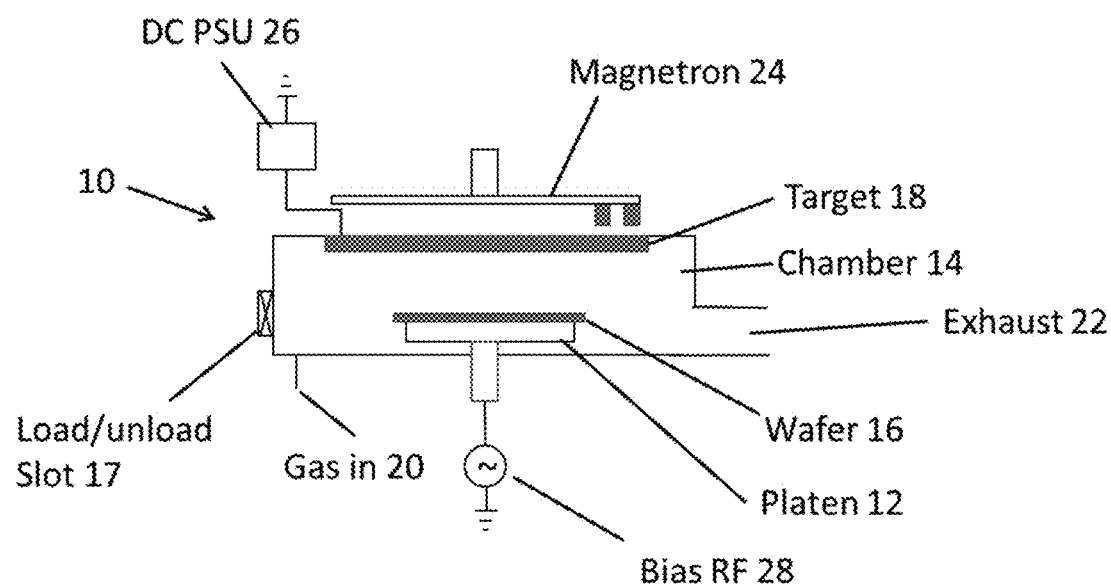
FIG. 1 is a schematic illustration of a sputtering apparatus suitable for performing methods in accordance with embodiments of the present invention.

Referring to FIG. 1, the magnetron sputtering apparatus 10 comprises a substrate support (e.g. a platen) 12, which is disposed within a chamber 14. The grounded, metallic chamber 14 is suitable for containing a plasma. The substrate support 12 is adapted to hold a substrate 16 in a substantially horizontal orientation, with a front surface of the substrate facing upwards. The substrate 16 can be a wafer, such as a silicon wafer. The substrate 16 can be a patterned silicon wafer. The substrate 16 can be loaded and unloaded via a suitable loading/unloading slot 17.

The apparatus 10 further comprises a target 18 disposed within the chamber 14. The target 18 and the substrate support 12 are arranged such that material sputtered from the target 18 can be deposited onto a substrate 16 being supported on the substrate support 12. Typically, the target 18 is held directly opposite and above the substrate support 12. The distance between the target 18 and the substrate 16 is about 10 cm or less, or optionally 75 mm or less. The target 18 is made from a sputtering material. The target 18 is made from a metallic material. The target can be made from molybdenum (Mo), tungsten (W), ruthenium (Ru), titanium (Ti), tantalum (Ta) or platinum (Pt). In exemplary methods of the present invention, the metallic material is typically a metal suitable for use as an electrode metal in a resonator device, such as a low thermo-elastic loss electrode metal.

Gas can enter the chamber 14 via a gas inlet 20, and can be pumped from the chamber via a gas exhaust 22. The apparatus 10 further comprises a plasma generating means for generating a plasma within the chamber 14. The apparatus 10 further comprises a magnetron 24 for generating a magnetic field proximate to the target 18 that localises the plasma adjacent the target 18. The magnetron 24 is disposed outside of the chamber 14. A power supply 26 is configured to provide a DC power to the magnetron 24 during operation.

A power supply 26 is configured to supply a power to the target 18. During a sputter deposition process, the target 18 acts as a cathode.

A power supply 28 can supply a RF bias power to the substrate support 12. A controller with a graphical user interface (not shown) may be used to control the power supplies.

In operation, a plasma is sustained by the plasma generating means and a power is applied to the target 18 so that species in the plasma (e.g. ions and neutral atoms) sputter material from the target 18. The sputtered material from the target 18 deposits onto the substrate 16 being supported on the substrate support 12 to form a metallic layer thereon. In a non-reactive sputtering process, the metallic layer is typically composed of the same material as the target 18.

In a first exemplary method, metallic layers were sputter deposited onto a 200 mm diameter silicon wafer using a DC magnetron sputtering method. This deposition process is part of a process for manufacturing a resonator device such as an acoustic wave device (e.g. a BAW or SAW device). The apparatus 10 used to deposit the metallic layer was a SPTS Sigma® deposition system with a DC magnetron sputtering module. In this example, the target 18 was made from molybdenum, and the metallic layers were composed of molybdenum.

The silicon substrate 16 was positioned onto the substrate support 12 within the deposition apparatus 10. The distance between the target 18 and the substrate 16 was set to about 10 cm.

A DC magnetron sputtering process was then performed to sputter Mo from the target 18 onto the substrate 16. A noble gas was introduced into the chamber 14 via a gas inlet 20 and a plasma generated. The noble gas can be argon, krypton, xenon or any combination thereof. In the first exemplary method, the noble gas used to generate the plasma was argon. A power was applied to the target (cathode) 18 so as to encourage the species in the plasma to sputter material from the target 18.

During the DC magnetron sputtering process, the chamber 14 has a pressure of at least 6 mTorr, and the power applied to the target 18 has a power density of at least 6 W/cm². Typically, the chamber pressure is in the range 6-20 mTorr. Typically, the target power density is in the range 8-24 W/cm².

Figure 2:
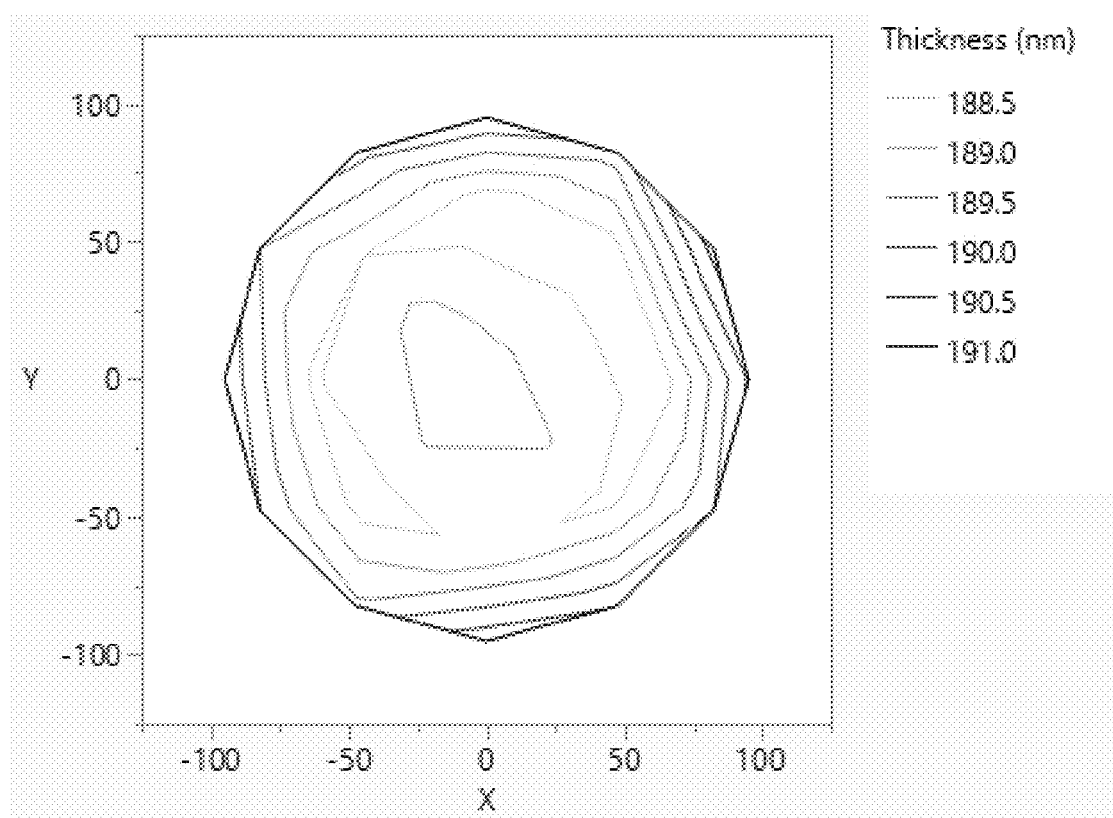
FIG. 2 shows the thickness variation of a metallic layer deposited using an exemplary method of the present invention.

The thickness, resistivity and stress of the deposited metallic layers were measured. The thickness of the metallic layer was measured using a non-destructive metrology measurement using a MetaPULSE™ instrument. FIG. 2 shows a contour map of the thickness of the as deposited Mo metallic layer. The average film thickness was 189.36 nm and the film showed excellent thickness uniformity with a 1σ value of 0.458% (see Table 1).

TABLE 1

| Thickness (nm) | Thickness 1sigma % | Rs (Ω/sq) | Rs 1sigma % | Bulk resistivity (μΩ · cm) |
|---|---|---|---|---|
| 189.36 | 0.458 | 0.4437 | 0.721 | 8.40 |

The sheet resistivity ($R_s$) of the metallic layer was measured using a four-point probe technique, and the resistivity determined using the following equation.

$R_s$ = resistivity/film thickness

Figure 3:
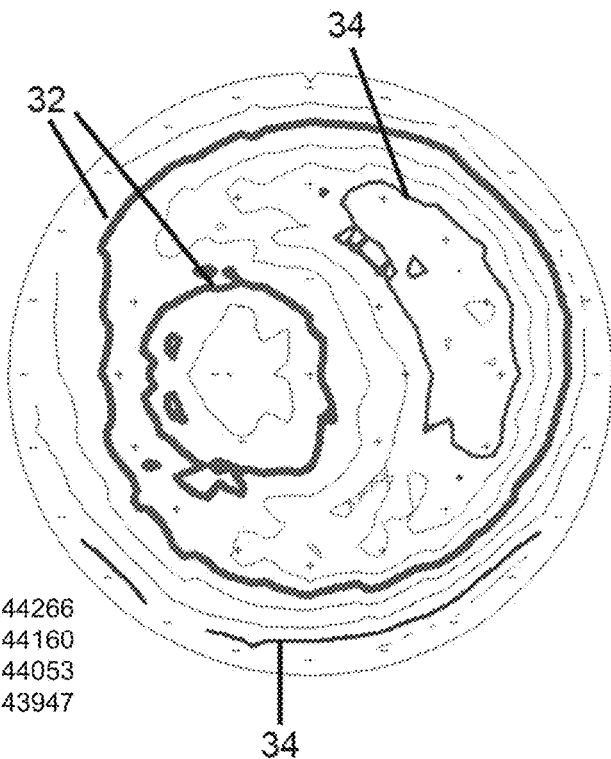
FIG. 3 shows the radial sheet resistivity of a metallic layer deposited using an exemplary method of the present invention.

FIG. 3 shows a contour map of the sheet resistivity of the as deposited film.

The average bulk resistivity was 8.4 μΩ·cm, as represented by the (thickest) lines 32. Values at one standard deviation are represented by (intermediate thickness) lines 34. The resistivity values achieved using the present method are far superior to (i.e. lower than) those known to have been previously reported. Additionally, the present method enables excellent thickness uniformity to be achieved.

The stress of the as deposited film can be controlled by applying a bias power, such as an RF bias power, to the substrate support 12 during the DC magnetron sputtering process. Typically, the RF bias power has a frequency of 13.56 Hz. However, other RF frequencies could be used. Table 2 shows how the bias power supplied to the substrate support affects the resistivity and stress in the as deposited Mo films under the same high power (i.e. at least 6 W/cm²) and high pressure (i.e. at least 6 mTorr) conditions.

TABLE 2

| Platen power (W) | Resistivity (μΩ · cm) | Resistivity 1σ% | Avg. Stress (MPa) | Stress Range (MPa) |
|---|---|---|---|---|
| 400 | 8.83 | 0.62 | −198 | 183 |
| 275 | 9.00 | 0.68 | 16 | 118 |
| 215 | 8.92 | 1.10 | 185 | 91 |

By applying an appropriate bias power to the substrate support (e.g. platen) 12, the average stress in the deposited metallic layer can be tuned. In general, a higher bias power applied to the substrate support 12 during the DC magnetron sputtering step causes the stress in the as deposited metallic layer to be more compressive (less tensile). The bias power supplied to the substrate support 12 can be tuned so that the deposited metallic layer can have an average stress of approximately 0 MPa. Furthermore, the high power and high pressure deposition conditions according to the present invention provide a resultant metallic layer exhibiting a stress variation across the film of <200 MPa. Further still, all films exhibited a low resistivity of μΩ·cm. Such metallic layers with uniform thickness, uniform stress, and low resistivity exhibit desirable properties that can be used to fabricate higher quality, smaller resonator devices, such as BAW and SAW devices with fewer losses.

These methods and results go against the currently received wisdom in the art. The currently received wisdom suggests that increasing the chamber pressure during the DC magnetron sputtering step, causes the sputtered material to be scattered to a greater degree and the energy of the sputtered material landing on the substrate 16 is decreased. This is believed to cause an increase in gas incorporation in the as deposited film, resulting in a less dense and less conductive metallic layer. However, the present inventors have found that contrary to this currently received wisdom, the combination of a high pressure (i.e. at least 6 mTorr) together with a high target power density (i.e. at least 6 W/cm²) can result in deposited metallic layers having an improved (lower) resistivity, whilst also affording excellent thickness uniformity and stress uniformity. The excellent (low) resistivity values of the metallic layer deposited using the present method suggests that the films are dense with minimal gas incorporation in the as deposited films. These metallic layers have improved characteristics and allow resonator devices with an improve quality factor to be produced.

Figure 4:
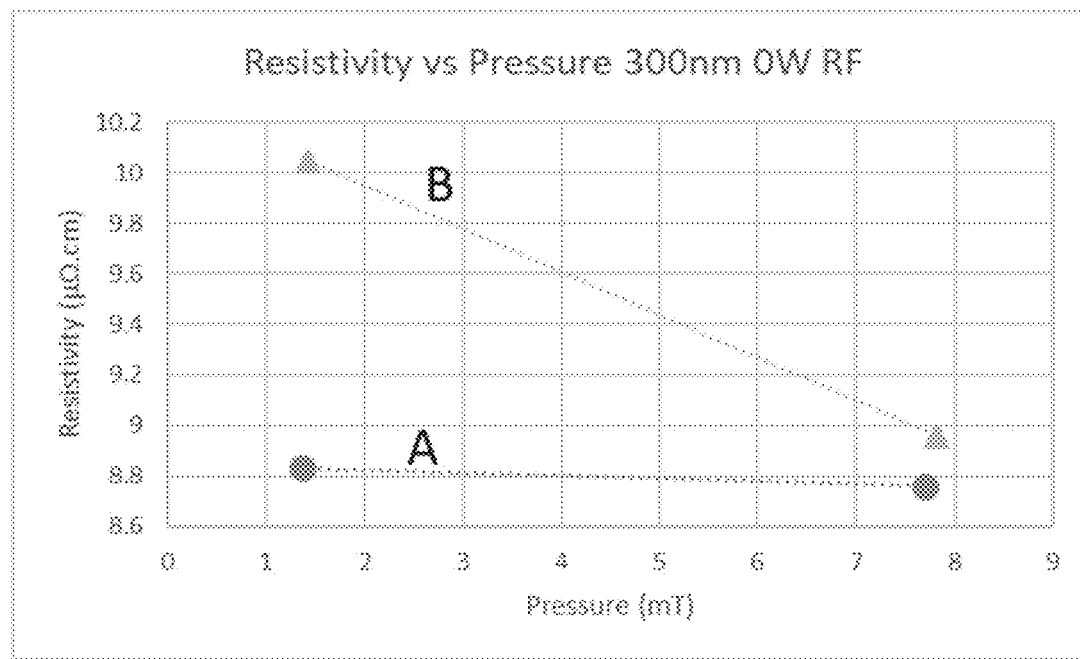
FIG. 4 shows a plot of resistivity (in μΩ·cm) as a function of pressure (in mTorr)

FIG. 4 shows a plot of how the resistivity of a 300 nm thick Mo metallic layer deposited using DC Magnetron sputtering varied as a function of chamber pressure (without any bias applied to the substrate support 12). Plot A used a power density applied to the target 18 of 6.77 W/cm². Plot B used a power density applied to the target 18 of 16.92 W/cm². The deposition temperature was 200° C.

Using a power density of 6.77 W/cm² (FIG. 4, Plot A) provided excellent resistivities (<9 μΩ·cm) at both high pressure (approx. 7.8 mTorr) and at low pressure (approx. 1.4 mTorr). However, increasing the pressure was found to further improve the resistivity (to <8.8 μΩ·cm). Operating at a higher pressure also provided a more tensile film, the stress of which could be tuned using a RF bias power applied to the substrate support 12. A RF bias power applied to the substrate support 12 generally causes the average stress in the metallic layer to become more compressive (less tensile). Therefore, in order to better control the average stress of the deposited layer, it is preferable that when no bias power is applied the deposited layer is slightly tensile. That is, the average stress of a more tensile film (e.g. deposited at higher pressure) can be tuned so that the average stress is about 0 MPa. The excellent (low) resistivity values suggest that these films are dense.

Figure 5:
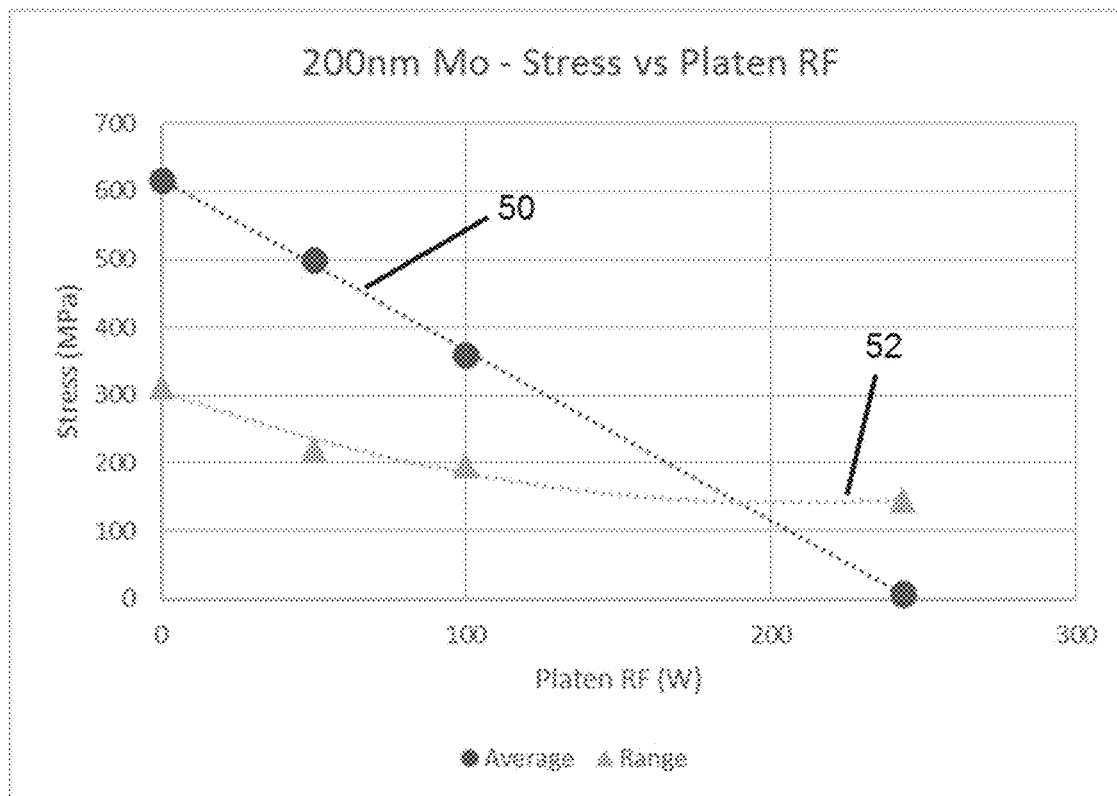
FIG. 5 shows average stress and stress range in a metallic layer as a function of platen power.

Using a power density of 16.92 W/cm² (FIG. 4, Plot B) at a low pressure (approximately 1.4 mTorr) resulted in a metallic layer having a sub-optimal resistivity (>10 μΩ·cm). However, as the pressure is increased (to approximately 7.8 mTorr), the sensitivity to the high power density operation is reduced enabling higher deposition rates while reducing the resistivity values of the deposited metallic layer (<9 μΩ·cm). FIG. 5 shows how the average stress (line 50, represented by circles) and stress range (line 52, represented by triangles) in an as deposited 200 nm thick Mo metallic layer varies as a function of bias power applied to the substrate support 12. The Mo metallic layer was deposited at a temperature of 200° C., at a pressure of about 8 mTorr and with a target power density of 6.77 W/cm². A substrate support bias power of about 240 W resulted in the Mo metallic layer having an average stress of about 0 MPa and a stress range of about 160 MPa.

Figure 6:
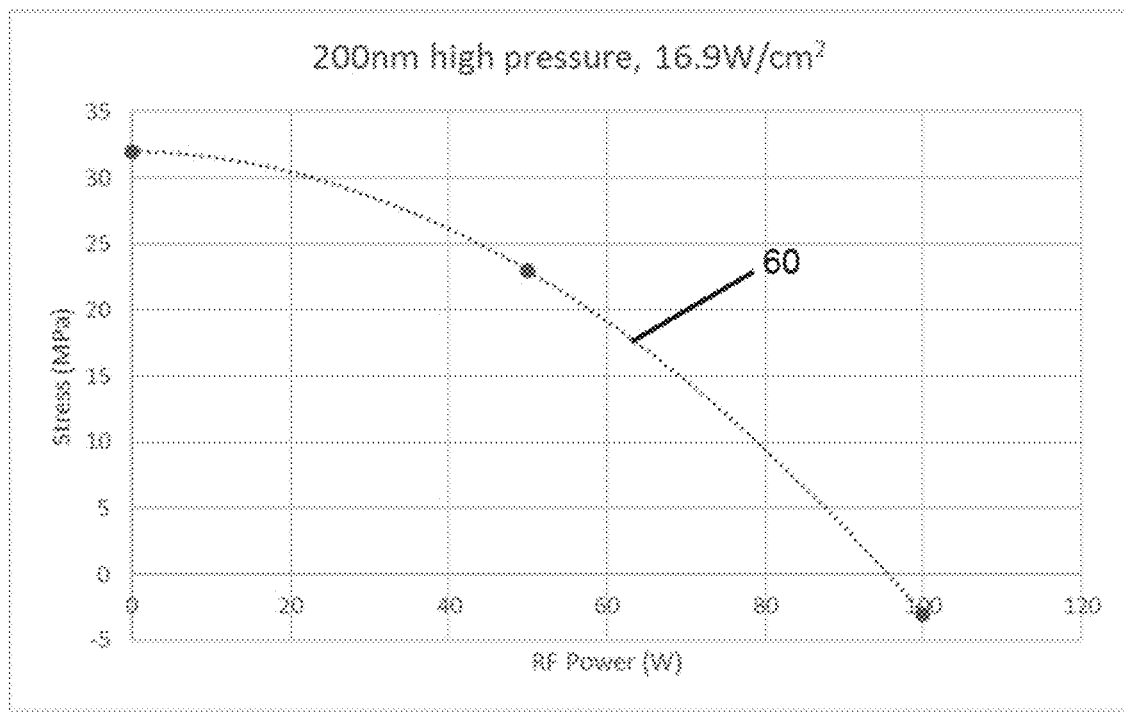
FIG. 6 shows average stress in a metallic layer as a function of platen power.

FIG. 6 shows how the average stress (line 60) in an as deposited 200 nm thick Mo metallic layer varies as a function of bias power applied to the substrate support 12. The Mo metallic layer was deposited at a temperature of 200° C., at a pressure of about 8 mTorr and with a target power density of 16.92 W/cm². A substrate support bias power of about 95 W resulted in the Mo metallic layer having an average stress of about 0 MPa.

Using the combination of high target power density together with high pressure (in accordance with the present invention), it was possible to deposit metallic layers that exhibited excellent stress uniformity of <120 MPa, and a thickness uniformity of <0.7 1σ % for a metallic layer having an average stress of 0 MPa. Additionally, low within wafer stress ranges of <200 MPa can be achieved at a variety of average stress while maintaining a thickness non-uniformity of <1.5% 1σ.

Table 3 illustrates exemplary processing parameters that can be used in accordance with exemplary methods of the present invention to deposit a metallic layer exhibiting an average stress of about zero. A comparative process is also shown.

TABLE 3

| | Comparative Process | Present invention |
| --- | --- | --- |
| Pressure (mTorr) | 2-4 | 6-12 |
| Platen RF (W) | 0 | 10-600 |
| Cathode power density (W/cm²) | 1-4 | 6-20 |
| Resistivity (μΩ · cm) | 10-12 | 8-10 |
| Stress Range (MPa) | >350 | <250 |

Without being bound by any theory or conjecture, it is believed that operating at a high pressure and target power density (in accordance with the present invention), there is sufficient flux of energetic ions and neutral species bombarding the substrate 16 to create a dense film with minimal levels of gas incorporation. The high target (cathode) power density compensates for any additional gas scattering that might otherwise result due to the higher chamber pressure. In turn, the high target power density compensates for any attenuation in energy of the ions and neutral species in the plasma due to an increase in chamber pressure, and thus provides suitable conditions to achieve a dense film. Therefore, the combination of using a high power density applied to the target 18 with a high chamber pressure causes the species in the plasma to have an optimum energy so as to form dense metallic layers exhibiting improved resistivity, excellent thickness uniformity, and stress control with excellent stress uniformity. Such films are suitable for applications as electrode layers in resonator devices, such as BAW and SAW devices.

Using a high chamber pressure and a high target (cathode) power density coupled with a controlled bias power applied to the substrate support 12, the present inventors have developed a method to deposit metallic layers exhibiting excellent thickness uniformity, improved resistivity (<10 μΩ·cm), and reduced stress range. Whilst the examples above primarily relate to the deposition of Mo metallic layers, the same process conditions can be used to sputter deposit other metals, such as tungsten, titanium, tantalum, platinum and ruthenium. The metallic layers deposited using the present methods meet the requirements for highly uniform, low stress Mo thin films, and are suitable for use as thin electrode layers in resonator devices such as BAW and SAW devices.

In a further exemplary method a resonator device, such as a BAW or SAW device was produced. A first metallic layer was sputtered deposited onto a substrate using the same DC magnetron sputtering methods described in relation to the first exemplary method. The substrate was a patterned silicon wafer.

Subsequently, a piezoelectric material was deposited onto the first metallic layer. The piezoelectric material layer can be made from AlN, AlScN or other suitable piezoelectric material.

A second metallic layer was then sputtered deposited onto the piezoelectric material layer using the same DC magnetron sputtering methods described in relation to the first exemplary method. The resulting resonator devices exhibited an improved quality factor.

What is claimed is:

1. A method of sputter depositing a metallic layer on a substrate in the fabrication of a resonator device, the method comprising the steps of:
providing a magnetron sputtering apparatus comprising a chamber, a substrate support disposed within the chamber, a target made from a metallic material, and a plasma generating device, wherein the substrate support and the target are separated by a distance of 10 cm or less;
supporting the substrate on the substrate support; and
performing a DC magnetron sputtering step that comprises sputtering the metallic material from the target onto the substrate so as to form a metallic layer on the substrate, wherein the metallic layer is composed of a metal selected from molybdenum (Mo), tungsten (W), titanium (Ti), tantalum (Ta), platinum (Pt) or ruthenium (Ru), and wherein during the DC magnetron sputtering step the chamber has a pressure of at least 6 mTorr of a noble gas, the target is supplied with a power having a power density of at least 6 W/cm², and the substrate has a temperature in the range of 200-600° C.

2. The method according to claim 1, wherein the substrate is a silicon substrate.

3. The method according to claim 1, wherein the power density is at least 8 W/cm².

4. The method according to claim 1, wherein the power density is less than about 24 W/cm².

5. The method according to claim 1, wherein during the DC magnetron sputtering step the chamber has a pressure of at least 7 mTorr.

6. The method according to claim 1, wherein during the DC magnetron sputtering step the chamber has a pressure of about 20 m Torr or less.

7. The method according to claim 1, wherein the DC magnetron sputtering step is performed at a temperature in the range of 300-500° C.

8. The method according to claim 1, wherein during the DC magnetron sputtering step, a bias power is supplied to the substrate support.

9. The method according to claim 8, wherein the bias power is an RF bias power.

10. The method according to claim 8, wherein the bias power has a power in the range of 10-600 W.

11. The method according to claim 1, wherein the DC magnetron sputtering step comprises sputtering the metallic material from the target using a plasma formed from the noble gas, and wherein the noble gas is argon (Ar), krypton (Kr), xenon (Xe), or a mixture thereof.

12. The method according to claim 1, wherein the metallic layer has a thickness of about 300 nm or less.

13. The method according to claim 1, wherein the distance is about 75 mm or less.

14. The method according to claim 1, wherein the resonator device is an acoustic wave device.

15. A method of fabricating a resonator device comprising the steps of:
   (a) providing a substrate;
   (b) depositing a first metallic layer onto the substrate;
   (c) depositing a piezoelectric layer onto the first metallic layer; and
   (d) depositing a second metallic layer onto the piezoelectric layer, wherein at least step (b) or step (d) is performed using the method according to claim 1.

16. A substrate comprising a molybdenum layer deposited using the method according to claim 1, wherein the molybdenum layer has a resistivity of less than about 10 µΩ·cm.

17. A resonator device comprising a molybdenum layer deposited using the method according to claim 1, wherein the molybdenum layer has a resistivity of less than about 10 µΩ·cm.

18. A resonator device according to claim 17, wherein the resonator device is an acoustic wave device.

* * * * *